(12) United States Patent
Fang et al.

(10) Patent No.: US 12,284,841 B2
(45) Date of Patent: Apr. 22, 2025

(54) COATED STEEL PLATE SUITABLE FOR INLINE THIN-FILM PHOTOVOLTAIC MODULE AND MANUFACTURING METHOD THEREFOR

(71) Applicant: BAOSHAN IRON & STEEL CO., LTD., Shanghai (CN)

(72) Inventors: Wenqi Fang, Shanghai (CN); Zhaohui Qiao, Shanghai (CN); Yigang Dai, Shanghai (CN)

(73) Assignee: BAOSHAN IRON & STEEL CO., LTD., Shanghai (CN)

( * ) Notice: Subject to any disclaimer, the term of this patent is extended or adjusted under 35 U.S.C. 154(b) by 34 days.

(21) Appl. No.: 18/260,197

(22) PCT Filed: Dec. 1, 2021

(86) PCT No.: PCT/CN2021/134805
§ 371 (c)(1),
(2) Date: Jun. 30, 2023

(87) PCT Pub. No.: WO2022/151857
PCT Pub. Date: Jul. 21, 2022

(65) Prior Publication Data
US 2024/0063319 A1    Feb. 22, 2024

(30) Foreign Application Priority Data
Jan. 12, 2021 (CN) .......................... 202110036449.3

(51) Int. Cl.
*H10F 77/169* (2025.01)
*H10F 77/70* (2025.01)
(52) U.S. Cl.
CPC ......... *H10F 77/169* (2025.01); *H10F 77/707* (2025.01)

(58) Field of Classification Search
CPC ........... H01L 31/0392; H01L 31/02366; H01L 31/03923; H01L 31/03928; H01L 31/18;
(Continued)

(56) References Cited

U.S. PATENT DOCUMENTS

2008/0176357 A1   7/2008   Huet et al.
2015/0340535 A1   11/2015  Asano
(Continued)

FOREIGN PATENT DOCUMENTS

CN   104025304 A   9/2014
CN   104681639 A   6/2015
(Continued)

OTHER PUBLICATIONS

English machine translation of JP2014107510A (Year: 2024).*
(Continued)

*Primary Examiner* — Angelo Trivisonno
(74) *Attorney, Agent, or Firm* — Christopher M. Scherer; DeWitt LLP

(57) ABSTRACT

The present invention provides a coated steel plate suitable for an inline thin-film photovoltaic module, comprising a steel substrate and a composite insulating layer on the surface of the steel substrate. The composite insulating layer comprises an insulating base layer and a laser scribing buffer layer; one side of the insulating base layer is the steel substrate, and the other side is the laser scribing buffer layer. The laser scribing buffer layer contains at least one of the following components: $Si_xN_y$, where $0.75 \leq x:y \leq 1$; and $Si_{1-x'}(R)_{x'}O_{y'}$, where R is an element selected from Sb, Au, Cu, Sn, and Ag, and $0 < x' \leq 0.05$, $1.9 \leq y' \leq 2$. Since the silicon nitride and the doped silicon dioxide used in the laser scribing buffer layer can exhibit specific colors, part of the energy of the laser can be absorbed during the laser etching process, and the damage and the loss of insulation of the
(Continued)

insulating base layer during etching can be avoided, thereby ensuring that the coated steel plate for inline thin-film photovoltaic modules provided by the present invention has stable working performance. Additionally, the present invention further discloses a method for manufacturing the aforementioned coated steel plate.

18 Claims, 5 Drawing Sheets

(58) Field of Classification Search
CPC ..... C21D 9/46; C23C 14/024; C23C 14/0652; C23C 14/08; C23C 14/021; C23C 14/10; C23C 16/0245; C23C 16/0272; C23C 16/345; C23C 16/40; C23C 14/022; C23C 14/06; C23C 14/083; C23C 14/16; C23C 14/165; C23C 16/0227; C23C 16/06; C23C 16/30; C23C 16/401; C23C 16/402; C23C 16/405

See application file for complete search history.

(56) References Cited

U.S. PATENT DOCUMENTS

| | | | |
|---|---|---|---|
| 2016/0049534 A1* | 2/2016 | Yano | B21B 1/40 72/200 |
| 2019/0237600 A1* | 8/2019 | Zhang | B23K 26/361 |

FOREIGN PATENT DOCUMENTS

| | | | |
|---|---|---|---|
| CN | 105449010 A | | 3/2016 |
| CN | 106571410 A | | 4/2017 |
| JP | 2014107510 A | * | 6/2014 |
| JP | 2014127711 A | | 7/2014 |
| JP | 2017050337 A | | 3/2017 |
| KR | 20140052212 A | | 5/2014 |

OTHER PUBLICATIONS

International Search Report and Written Opinion issued Mar. 4, 2022, in connection with international application No. PCT/CN2021/134805 issued from the Chinese Patent Office.

Office Action issued from the Japanese Patent Office on Mar. 19, 2024, in connection with corresponding JP patent application No. 541363/2023.

Examination Report issued from the Australian Patent Office on Apr. 4, 2024, in connection with corresponding AU patent application No. 2021420432.

Extended Search Report issued from the European Patent Office on May 16, 2024, in connection with corresponding EP patent application No. 21919048.5.

Satoh T et al: "Cu (In, Ga) Se"2 solar cells on stainless steel substrates covered with insulating layers", Solar Energy Materials and Solar Cells, Elsevier Science Publishers, Amsterdam, NL, vol. 75, No. 1-2, Jan. 1, 2003.

Qin Juan et al: "Silicon nitride films a the diffusion barriers for flexible CIGS thin film solar cells",Seventh International Conference on Thin Film Physics and Applications, SPIE, 1000 20th St. Bellingham WA 98225-6705 USA, vol. 7995, No. 1, Oct. 11, 2010.

* cited by examiner

COATED STEEL PLATE SUITABLE FOR INLINE THIN-FILM PHOTOVOLTAIC MODULE AND MANUFACTURING METHOD THEREFOR

CROSS-REFERENCE TO RELATED APPLICATIONS

The present application is the U.S. National Stage application of International Application No. PCT/CN2021/134805, filed Dec. 1, 2021, which International Application was published on Jul. 21, 2022, as International Publication No. WO2022/151857. The International Application claims priority to Chinese Patent Application No. 202110036449.3, filed Jan. 12, 2021, the contents of which are incorporated herein by reference in their entireties.

TECHNICAL FIELD

The present invention relates to a metal material and a manufacturing method therefor, particularly to a coated steel plate suitable for inline thin-film photovoltaic modules and a manufacturing method therefor.

BACKGROUND

Currently, common photovoltaic cell modules comprise: crystalline silicon-based monocrystalline and polycrystalline photovoltaic modules, as well as thin-film photovoltaic modules such as copper indium gallium selenide (CIGS), cadium telluride (CdTe), and amorphous silicon (a-Si), and other newly developed photovoltaic cells such as compound semiconductor thin-film photovoltaic cells, dye-sensitized photovoltaic cells, perovskite photovoltaic cells, and organic thin-film photovoltaic cells. In recent years, with the advancement in technology and the expansion of various applications such as building integrated photovoltaics, mobile photovoltaic transportation, etc., the market has presented various new requirements for the service performance of the photovoltaic modules, such as light weight, high strength, high toughness, flexibility, and durability.

Currently, mainstream photovoltaic cells mainly use glass substrates as front and rear cover plates or base materials. However, glass substrates have the disadvantages such as heavy weight, poor bearing capacity, being prone to self-explosion, likely causing light pollution, poor fire resistance, and lack of flexibility. In order to complement glass substrates, polymer materials and metal substrates have also been introduced. However, due to the brittle nature of crystalline silicon materials, flexible substrates are mainly used in thin-film photovoltaic cells. It should be noted that thin-film cells such as CISG, CdTe, and a-Si have already achieved commercialization and stable service performance, and the process of depositing semiconductor compound films on substrates requires high-temperature heat treatment. For example, in the heat treatment or deposition process of a CIGS or CdTe light absorption layer in the production line, the substrate typically needs to be held at a temperature of 500-650° C. for 2-30 minutes. Additionally, the processes above also involve corrosive gases such as Se, $H_2S$, and $CdCl_2$, and therefore alternative substrate materials must have heat resistance to temperatures above 500° C. and sufficient corrosion resistance to corrosive gases. Currently known common polymer substrates, such as polyimide films, have a maximum heat resistance temperature of only 400° C., and a certain amount of thermal decomposition products are inevitably released during the high temperature processes, posing contamination risks to the heat treatment atmosphere and the composition of the compound thin films. Therefore, the heat treatment temperature must be limited in the manufacturing process of the thin-film cells, or the photoelectric conversion performance of the thin-film cell modules will be affected.

Compared to polymer substrates, common metal materials such as aluminum, copper, titanium, and steel respectively have melting points of 660° C., 1083° C., 1668° C., and 1400° C. (depending on the steel composition), and they have certain temperature resistance within the range of 500-650° C. It should be noted that the thermal expansion coefficient (CTE) of the aluminum or aluminum alloy materials at high temperatures is typically $(20\text{-}30) \times 10^{-6} K^{-1}$, significantly higher than $(8\text{-}15) \times 10^{-6} K^{-1}$ of CIGS and CdTe type functional semiconductor polycrystalline materials. During the process of heat treatment or deposition of the thin-film photovoltaic cells, it is liable to cause phenomena of film cracking and interface adhesion failure due to inconsistent thermal expansion between the functional semiconductor film and the aluminum or aluminum alloy substrate materials. Similarly, copper or copper alloy and titanium or titanium alloy are rarely used in actual production in the thin-film photovoltaic industry due to factors such as overall cost and processing complexity.

Compared to aluminum, copper, and titanium, various types of steel, especially stainless steel substrates, have good comprehensive advantages in performance and cost, and are highly suitable for low-cost mass production of roll-to-roll type or sheet-to-sheet type thin-film modules.

For example, the Chinese patent document CN105051915B, published on Mar. 15, 2017, titled "Ferritic stainless steel foil for solar cell substrates and manufacturing method therefor", discloses a ferrite stainless steel foil for solar cell substrates and its manufacturing method. The focus is on the manufacturing method of stainless steel foil with a thickness of 0.01-0.2 mm and a metal coating (like Cr) on the surface to prevent high-temperature diffusion of iron (Fe) ions. This type of stainless steel material is not subjected to insulation treatment on the surface, making it impossible to achieve voltage or current improvement through internal series connection. After a photovoltaic functional layer is coated, the stainless steel material needs to be cut into small sizes and connected externally with wires to meet the rated current and voltage requirements of the module. In addition, an additional back encapsulation material (usually a glass substrate or a polymer thin film) is required to encapsulate and provide mechanical support to the entire wire series connection structure.

Another example is Chinese patent document CN100482461C, published on Apr. 29, 2009, titled "Stainless-steel foils with inorganic/organic hybrid film coating", discloses a stainless steel foil coated with an inorganic-organic hybrid film. The inorganic-organic hybrid film comprises a skeleton formed of an inorganic three-dimensional network structure mainly comprising a siloxane bond, with at least one cross-linked oxygen of the skeleton being replaced by an organic group and/or a hydrogen atom. For this type of film, a completely dense film cannot be formed due to the structural characteristics, and it is difficult to provide a sufficient breakdown voltage (≥200V). In addition, under the heat treatment or deposition conditions of 500-650° C., the organic functional groups in the hybrid film layer structure will inevitably undergo thermally decomposition and volatilization, posing contamination risks to the heat treatment atmosphere and components of the compound thin film. Therefore, the stainless steel foil coated with the inorganic-organic hybrid film is not suitable for the current most commonly used CIGS and CdTe thin-film cell production processes.

Another example is Chinese patent document CN100499174C, published on Jun. 10, 2009, titled "Metal strip product", provides a coated steel product has a coating comprising an electrically insulating layer doped with sodium. The coated steel product achieves the purpose of diffusion into a CIGS layer during CIGS production by adding a small amount of alkali metal to multiple layers of insulating metal oxides. However, current research shows that it is different to precisely control the amount of alkali metal diffusion through a substrate during the production of CIGS cells, which is liable to cause uneven doping and affect cell efficiency. Current industrial production adopts a synchronous alkali metal supplementation method during the CIGS film forming process. Therefore, the invention is unsuitable for the currently common CIGS thin-film cell production processes.

In summary, existing patent technologies have their respective drawbacks in the practical applications of commercial thin-film cells. Furthermore, the design of the current insulating film systems on the metal substrate surfaces does not consider the compatibility with the laser scribing process during the actual interconnection of thin-film modules.

SUMMARY

To solve the problem of the inability of the existing insulating film system on the metal substrate surface to adapt to inline thin-film photovoltaic modules, the present invention provides a coated steel plate suitable for inline thin-film photovoltaic modules, which comprises a steel substrate and a composite insulating layer on the surface of the steel substrate. The composite insulating layer comprises an insulating base layer and a laser scribing buffer layer. One side of the insulating base layer is the steel substrate, and the other side is the laser scribing buffer layer. The laser scribing buffer layer contains at least one of the following components:

$Si_xN_y$, where $0.75 \leq x:y \leq 1$; and
$Si_{1-x'}(R)_{x'}O_{y'}$, where R is at least one element selected from Sb, Au, Cu, Sn, and Ag, and $0 < x' \leq 0.05$, $1.9 \leq y' \leq 2$.

Referring to FIG. 3, the composite insulating layer comprises an insulating base layer adjacent to the steel substrate and a laser scribing buffer layer located above the insulating base layer. For example, in some embodiments, the composite insulating layer may comprise a $SiO_2$ insulating base layer and a $Si_3N_4$ laser scribing buffer layer. One side of the $SiO_2$ insulating base layer is the steel substrate, and the other side is the $Si_3N_4$ laser scribing buffer layer. The silicon oxides and nitrides served as the laser scribing buffer layer materials have the characteristic of high temperature resistance, allowing them to maintain their structures without being damaged during the coating process.

Additionally, it should be noted that since the thin-film photovoltaic modules usually require laser scribing (cutting) of the bottom electrode for the purposes of connecting the modules in series, the energy of the laser beam must be sufficient to penetrate the metal bottom electrode. This inevitably causes residual energy reaching the insulating base layer of the composite insulating layer after penetrating the bottom electrode, and in severe cases, it may even reach the steel substrate of the base, resulting in a short circuit in the module. However, the silicon nitride and the doped silicon dioxide used in the laser scribing buffer layer of the composite insulating layer can exhibit specific colors and absorb some of the laser's energy during the laser scribing process. This helps to dissipate or mitigate the residual energy when laser scribing the metal bottom electrode, thereby avoiding damage and loss of insulation of the oxide insulating base layer at the bottom.

In the present application, it is necessary to control $0 < x' \leq 0.05$. On the one hand, proper metal doping can give $SiO_2$ a specific color and absorb some laser energy during the laser scribing process, acting as a buffer for the insulating base layer. On the other hand, the doping amount of metal should not be too high, as it may cause the loss of insulation properties in the laser scribing buffer layer.

In addition, it is important to control $1.9 \leq y' \leq 2$. It should be understood that in the coating process, it is very difficult to ensure that the oxides serving as the insulating base layer have a specific stoichiometric proportion. Taking $SiO_2$ as an example, oxygen vacancies may occur during the coating process, resulting in y' being smaller than 2. Similarly, nitrogen (N) vacancies may occur during the $Si_3N_4$ coating process, resulting in $x:y > 0.75$.

The laser scribing buffer layer should be dense, smooth, and form a good adhesion with the insulating base layer. The laser scribing buffer layer can also play a passivation role and prevent defects and pinholes in the insulating base layer from affecting the insulation of the insulating base layer.

Further, in the coated steel plate provided by the present invention, it is controlled that $0.75 < x:y < 0.90$.

The laser scribing buffer layer can be of nonstoichiometric silicon nitride ($Si_xN_y$), where $0.75 < x:y \leq 1$, preferably, $0.75 < x:y < 0.95$, and most preferably, $0.75 < x:y < 0.90$. On the one hand, this ratio ensures sufficient insulation properties of the buffer layer, and on the other hand, there are N vacancies, so that the laser scribing buffer layer exhibits specific colors and can absorb some laser energy in terms of light absorption characteristics during the laser scribing. In addition, when the laser scribing buffer layer is colored silicon oxide $(Si_{1-x'}(R)_{x'}O_{y'})$ doped with element R, selected from Sb, Au, Cu, Sn, and Ag, and $Si_{1-x'}(R)_{x'}O_{y'}$ with different metal dopants can exhibit colors such as purple, yellow, green, red, and white. The element R is preferably selected from Au, Cu, and Ag. These doping elements can be premixed with $SiO_2$ or Si target material before deposition and the deposition is carried out under the oxygen-containing carrier gas conditions. Or the target material of the simple substance of R element can also be used in conjunction with the $SiO_2$ or Si target material during disposition under the oxygen-containing carrier gas conditions to achieve film doping.

The overall thickness of the entire laser scribing buffer layer can be controlled between 50 to 1,000 nm, and preferably between 100 to 500 nm. A small film thickness can effectively control costs and avoid the problem of cracking that may occur during preparation due to brittleness of an excessively thick film.

Preferably, in the coated steel plate of the present invention, the insulating base layer is composed of at least one of the following components: $SiO_{2-m}$, $HfO_{2-m}$, $Si(Hf)O_{2-m}$, and $Ta_2O_{5-2m}$, where $0 \leq m \leq 0.05$.

Preferably, in the coated steel plate of the present invention, the insulating base layer contains at least one of the following components: $SiO_{2-m}$, $HfO_2$, $Si(Hf)O_2$, and $Ta_2O_5$, where $0 \leq m \leq 0.05$.

The chemical composition of the insulating base layer should be oxides with a high thermal stability and a higher dielectric coefficient. Examples of suitable oxides include $SiO_2$, $HfO_2$, $Si(Hf)O_2$, $Ta_2O_5$, or the mixture thereof. $SiO_2$ and/or $HfO_2$ are preferred, with $SiO_2$ being the most preferred. As mentioned above, in the coating process, it is very difficult to ensure specific stoichiometric proportions of oxides. A certain degree of oxygen vacancies can be allowed in these materials. Taking $SiO_2$ as an example, as long as its oxygen-deficient form $SiO_{2-m}$ satisfies $0<m\leq0.05$, it can also be used as a component of the insulating base layer. Similarly, for $HfO_2$, $Si(Hf)O_2$, and $Ta_2O_5$ in the present invention, if their oxygen-deficient forms $HfO_{2-m}$, $Si(Hf)O_{2-m}$, and $Ta_2O_{5-2m}$ can also satisfy that $0<m\leq0.05$, $HfO_2$, $Si(Hf)O_2$, and $Ta_2O_5$ can also be used as components of the insulating base layer.

Preferably, in the coated steel plate of the present invention, the insulating base layer can be of a single-layer structure or a multi-layer structure. When the insulating base layer is of a multi-layer structure, the components of each layer can be the same or different.

When the insulating base layer is of a single-layer structure, pinholes or defects that penetrate through the layer may occur during the preparation process. Therefore, the film thickness needs to be increased to avoid such occurrences and ensure insulation.

When the insulating base layer is of a multi-layer structure, compared to a single-layer structure, the advantage is that it can block pinholes and hidden cracks which may occur in a single-layer structure by setting different layers, thereby reducing the overall thickness of the film system.

When depositing multi-layer oxide insulating layers, these layers can be formed by the same or different oxides, and each single layer can also be composed of mixtures of several metal oxides. As long as it is a multi-layer structure, pinholes and defects generated in the single-layer coating process can be blocked by the adjacent film layers to ensure insulation.

It is generally not recommended for the multi-layer structure of the insulating base layer to exceed three layers, as having too many layers can cause interfacial delamination and other defects, making the manufacturing process complex and increasing production costs. A bottom layer in direct contact with the steel substrate can be a transition layer with properties similar to the steel substrate, further reducing the internal stress between the steel substrate and the insulating base layer. Each single layer in the multi-layer structure has a thickness of 0.1 to 3 μm, preferably 0.1 to 1 μm.

Regardless of whether the insulating base layer is of a single-layer structure or a multi-layer structure, the total thickness of the entire insulating base layer should not exceed 9 μm. The total thickness is controlled within the range of 0.1 to 9 μm to avoid the risk of cracking in thicker films. It is preferably controlled within the range of 0.25 to 6 μm, which can help save costs.

Preferably, in the coated steel plate of the present invention, the thermal expansion coefficient of the steel substrate satisfies the following:
 a thermal expansion coefficient at 0 to 100° C. is (10 to 11)×10$^{-6}$/° C.;
 the thermal expansion coefficient at 100 to 315° C. is (10.5 to 11)×10$^{-6}$/° C.; and
 the thermal expansion coefficient at 315 to 650° C. is (11 to 11.5)×10$^{-6}$/° C.

It should be noted that in the present invention, the most important property of the steel substrate is to have a low thermal expansion coefficient (CTE) to match the CTE of oxides/nitrides (such as $SiO_2$: 5.6×10$^{-6}$/° C., $HfO_2$: 6×10$^{-6}$/° C., $Ta_2O_5$: 6.7×10$^{-6}$/° C., $Si_3N_4$: 4.3×10$^{-6}$/° C., measured at 25° C.) of the composite insulating layer and a thin-film photovoltaic light absorption layer (such as CIGS: 8-12×10$^{-6}$/° C., CdTe: 4.8×10$^{-6}$/° C., a-Si: 4×10$^{-6}$/° C., measured at 25° C.), thereby avoiding delamination or cracking of the composite insulating layer deposited on the steel substrate or the thin-film photovoltaic module in the preparation process due to significant difference in the thermal expansion coefficient. The thermal expansion coefficients of the aforementioned oxide/nitrides, CdTe, and a-Si can be referenced from the "List of Thermal Expansion Coefficients (CTE) for Natural and Engineered Materials" (https://www.msesupplies.com/), and the thermal expansion coefficient of the CIGS can be referenced from "Solar Energy 77, (2004), 685-695".

The material of such steel substrate should have sufficient corrosion resistance to withstand the working environment throughout the lifecycle of a photovoltaic cell. Ferrite 400 series stainless steel can be selected.

Preferably, in the coated steel plate of the present invention, the steel substrate is a strip foil steel coil with a thickness of 5 to 180 μm.

Preferably, in the coated steel plate of the present invention, the steel substrate is a sheet-like rigid plate with a thickness of 0.3 to 2.0 mm.

Depending on the different requirements for the flexibility and rigidity of the base material in inline thin-film photovoltaic modules, the steel substrate can be delivered in the form of a strip foil steel coil or a sheet-like stainless steel plate. For flexible stainless steel strip foil coil, the thickness should be within the range of 5 to 180 μm, preferably controlled within 15 to 50 μm. This thickness range enables the base material to have sufficient flexibility while maintaining sufficient tear resistance. For sheet-like rigid stainless steel plates, the thickness should be within a range of 0.3 to 2.0 mm, preferably controlled within 0.4 to 1.0 mm. This thickness range can guarantee the base material to have sufficient rigidity while reducing the weight and cost per unit area of the base material.

Preferably, in the coated steel plate of the present invention, the arithmetic mean deviation of the profile, Ra, representing surface roughness of the steel substrate, is smaller than 0.3 μm, and the maximum height of the profile, Rz, representing the surface roughness of the steel substrate, is smaller than 1 μm.

It should be noted that another important parameter of the steel substrate is the surface roughness, and a lower surface roughness is preferred. Ra (arithmetic mean deviation of the profile), representing the surface roughness, should be smaller than 0.3 μm, and Rz (maximum height of the profile), also representing the surface roughness, should be smaller than 1 μm. It is preferable to have Ra smaller than 0.07 μm and Rz smaller than 0.3 μm. Smaller Ra and Rz values not only reduce the coating thickness required for the insulating base layer to reduce cost, but also prevent local insulation breakdown caused by tip discharge. The definition and explanation of parameters for characterizing surface roughness can be found in GB/T 3505-2000.

Preferably, in the coated steel plate of the present invention, the composite insulating layer has a back contact layer formed by depositing a metal bottom electrode on its surface.

In the aforementioned technical solution of the present invention, depending on different thin-film photovoltaic procedures on the downstream and specific requirements of different users, the metal bottom electrode required for the corresponding inline thin-film photovoltaic module can be deposited on the surface of the composite insulating film layer to form the back contact layer.

Preferably, in the coated steel plate of the present invention, the back contact layer can be made of one of the following: Mo or Mo alloy; Cu or Cu/C composite material; Al or Al alloy; Ag; Au; and Pt.

The aforementioned back contact layer should be dense, smooth, and have good adhesion to the composite insulating layer. Depending on the type of thin-film cell, the material for the back contact layer can be Mo or Mo alloy (for CIGS cells), Cu or Cu/C composite material (for CdTe cells), Al or Al alloy (for amorphous/microcrystalline silicon cells), and Ag, Au, or Pt (for GaAs photovoltaic cells, perovskite photovoltaic cells, and various organic semiconductor photovoltaic cells).

Preferably, in the coated steel plate of the present invention, the thickness of the back contact layer is 20 nm to 2 μm.

Preferably, the thickness of the back contact layer is controlled within a range of 50 nm to 800 nm, and more preferably within 50 nm to 500 nm. The thinner film thickness can effectively control costs and avoid the cracking problem during the preparation process due to brittleness of the excessively thick film.

Preferably, the surface of the back contact layer can also be treated by laser etching or mechanical scribing depending on requirements of the thin-film photovoltaic series connection modules on the downstream to form circuit patterns with proper widths and gaps. The depth of etching or scribing should be greater than or equal to the thickness of the back contact layer to ensure that the back contact layer is penetrated. The width of the etching line or scribing lines should be controlled between 20 μm to 100 μm, and preferably between 30 μm to 60 μm. The gap between two adjacent etching lines or scribing lines can be customized based on customer requirements, generally ranging between 5 to 20 mm, preferably, between 5 to 10 mm.

Correspondingly, another objective of the present invention is to provide a method for manufacturing the aforementioned coated steel plate suitable for inline thin-film photovoltaic modules. The surface of the coated steel plate for the inline thin-film photovoltaic module has proper roughness, stable heat resistance, and good resistance to various chemical media. Furthermore, the thermal expansion coefficient of the steel substrate of the coated steel plate matches the thermal expansion coefficients of the composite insulating layer and the light absorption layer of the inline thin-film photovoltaic module, making it highly promising and valuable for commercialization.

In order to achieve the objective above, the present invention provides a method for manufacturing the coated steel plate, which comprises the following steps:
preprocessing the surface of the steel substrate; and
depositing the insulating base layer and the laser scribing buffer layer on the surface of the steel substrate.

Additionally, the coated steel plate suitable for inline thin-film photovoltaic modules in the present invention can also comprise a back contact layer. If a back contact layer is included, the method for manufacturing the coated steel plate comprises the following steps:
S1: preprocessing the surface of the steel substrate; and
S2: Successively depositing the insulating base layer, the laser scribing buffer layer, and the back contact layer on the surface of the steel substrate.

In the above technical solution of the present invention, it is necessary for the insulating base layer in the coated steel plate to have good adhesion to the surface of the steel substrate, allowing the inline thin-film photovoltaic module to have a certain degree of flexibility. In the present invention, the adhesion performance can be optimized by preprocessing the surface of the steel substrate. The first step is to remove residual oil and dirt from the surface of the steel substrate in a proper manner to ensure that these impurities do not affect the adhesion and quality of the coating layer during the subsequent coating process. In addition, plasma bombardment etching or extreme ultraviolet (EUV) irradiation can be used to activate the surface of the steel substrate before coating.

It should be noted that in the present invention, the selected material for the insulating base layer should have a high dielectric coefficient and breakdown voltage to achieve a dense and smooth insulating base layer through process control, thereby obtaining good insulation performance.

Compared to the prior art, the coated steel plate suitable for inline thin-film photovoltaic modules and the manufacturing method therefor, as provided by the present invention, have the following advantages and beneficial effects:

the present invention provides a film system combination that can form good adhesion to the surface of a steel substrate, exhibit good chemical resistance, high temperature resistance, excellent insulation performance, and proper surface roughness, and a manufacturing method therefor. By forming a continuous, uniform, and dense composite insulating layer on the surface of the steel substrate, it can be ensured that the surface of the coated steel plate for the inline thin-film photovoltaic modules, has proper roughness, stable heat resistance, and good resistance to various chemical media. Single-layer film systems are prone to have penetrating pinholes during the coating process, compromising of the insulating function of the insulating layer. By using the composite insulating layer, the problem of pinholes associated with single-layer film systems can be prevented, thus preserving the insulation properties of the thin film. The method for manufacturing the coated steel plate provided by the present invention is well matched with the laser scribing series connection procedure performed during the production of inline thin-film photovoltaic modules, which is of great practical significance in meeting the production requirements of the inline thin-film photovoltaic modules.

BRIEF DESCRIPTION OF THE DRAWINGS

To make the above content of the present invention more clearly understandable, preferred embodiments are described below in details in conjunction with the accompanying drawings.

DETAILED DESCRIPTION

Figure 1:
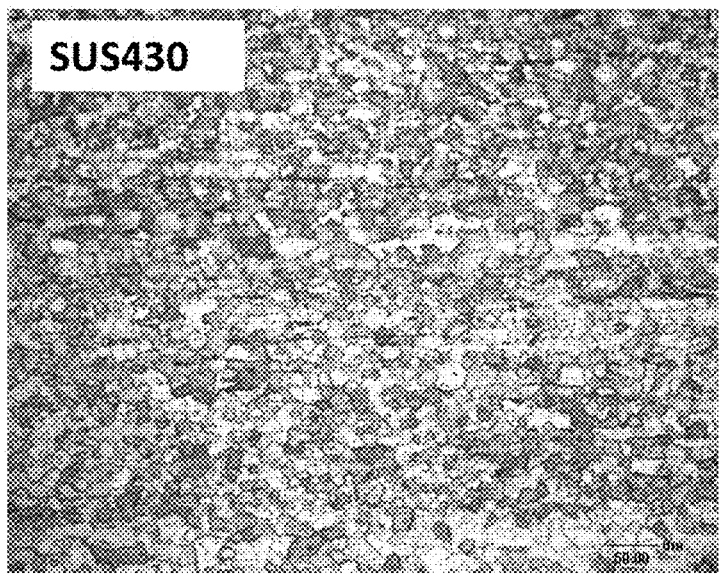
FIG. 1 is a microstructure image of SUS430 steel substrate.

The implementation mode of the present invention will be illustrated below by the following specific embodiments, and those skilled in the art can easily understand other advantages and effects of the present invention based on the disclosure in the description. Although the description of the present invention will be presented in conjunction with preferred embodiments, it should be understood that the features of the present invention are limited to the specific embodiments. On the contrary, the objective of presenting the present invention in conjunction with the implementation mode is to cover other selections or modifications that may be derived from the claims of the present invention. In order to provide a deep understanding of the present invention, the following description will contain many specific details. However, the present invention can also be implemented without using these details. In addition, to avoid confusion or obscuring of the focus of the present invention, some specific details may be omitted in the description. It should be noted that, unless conflicting, the embodiments in the present invention and the features in the embodiments can be combined with each other.

Examples 1-46 and Comparative Examples 1-8

The coated steel plates suitable for the inline thin-film photovoltaic modules in Embodiments 1-46 of the present invention and comparative steel plates in Comparative Examples 1-8 are manufactured using the following steps.

S1: preprocessing a steel substrate: selecting two materials, i.e., an SUS430 strip foil steel coil and a B430LNT sheet-like rigid plate respectively, as the materials for the steel substrate, depending on different requirements of inline thin-film photovoltaic modules for the substrate flexibility and rigidity, as well as the different requirements for subsequent processing and serviceability of different thickness substrates. Among them, the maximum width of the SUS430 strip foil steel coil can be 1,000 mm; and the maximum width of the B430LNT can be 1,500 mm.

SUS430: ferrite stainless steel according to the Japanese standard JIS G4303-2012.

B430LNT: ferrite stainless steel according to the enterprise standard Q/BXS 009-2017 of Ningbo Baoxin Stainless Steel Co., Ltd.

Based on the general 400-series ferrite stainless steel, B430LNT reduces the content of impurity elements such as N and S to a very low level and adds alloying elements such as Nb and Ti. Since Nb has a strong effect of fixing carbon and nitrogen and refining the grain grain size of ferrite, B430LNT has a very uniform and fine ferrite structure in an annealed state, with very little precipitation of carbonitrides at grain boundaries. Therefore, B430LNT has better corrosion resistance, formability, and wrinkle resistance than SUS430.

The selected SUS430 steel strip and B430LNT steel plate have undergone the pretreatment process including at least cold rolling, bright annealing, and leveling. They both have a surface glossiness and flatness at BA (bright annealed and leveled surface) level or higher. The surface roughness of the selected SUS430 steel strip and B430LNT steel plate should be controlled as low as possible, with Ra<0.3 μm and Rz<1 μm. Preferably, it can be controlled that Ra<0.07 μm and Rz<0.3 μm. In addition, SUS430 steel strip and B430LNT steel plate, as the steel substrate materials, need to satisfy the thermal expansion performance requirements: in the temperature range of 0 to 100° C., the thermal expansion coefficient is (10 to 11)×10$^{-6}$/° C.; in the temperature range of 100 to 315° C., the thermal expansion coefficient of (10.5 to 11)×10$^{-6}$/° C.; and in the temperature range of 315 to 650° C., the thermal expansion coefficient is (11 to 11.5)×10$^{-6}$/° C. After the surfaces of the two types of steel substrates are flushed by high pressure water, the surfaces of the steel substrates are quickly dried by blowing compressed air. Then, in a N$_2$ atmosphere, the upper surface of the steel substrate strip is irradiated by a flat tube type 172 nm extreme ultraviolet (EUV) light source with an intensity of 50 mW/cm$^2$. This process removes residual small organic molecules on the surface of the steel substrate and enhances the reactivity of the steel substrate surface. After EUV irradiation, the water contact angle on the surface of the above-mentioned two types of steel substrate strips is less than 10°.

S2: depositing a composite insulating layer on the surface of the steel substrate: directly depositing an insulating base layer on the surface of the steel substrate strip using a continuous roll-to-roll type or sheet-to-sheet type coating line on one surface of the above-mentioned two types of steel substrates, and then depositing a laser scribing buffer layer consisting of nitrides or oxides on the surface of the insulating base layer to manufacture the coated steel plate suitable for inline thin-film photovoltaic modules. In various examples and comparative examples of the present invention, the thickness of the entire insulating base layer is controlled within a range of 0.1 to 9 μm, the thickness of the entire laser scribing buffer layer is controlled within a range of 50 to 1,000 nm. The insulating base layer and the laser scribing buffer layer on the surface of the insulating base layer together form a composite insulating layer.

The insulating base layer is composed of at least one of the following components: SiO$_{2-m}$, HfO$_{2-m}$, Si(Hf)O$_{2-m}$, and Ta$_2$O$_{5-2m}$, where 0≤m≤0.05. The insulating base layer can be of a single-layer structure or a multi-layer structure, and the components constituting each layer can be the same or different. The thickness of each single layer of the insulating base layer is controlled within a range of 0.1 to 3 μm.

The laser scribing buffer layer is composed of at least one of the following components: Si$_x$N$_y$, where 0.75≤x:y≤1; and Si$_{1-x'}$(R)$_{x'}$O$_{y'}$, where R is an element selected from Sb, Au, Cu, Sn, and Ag, and 0<x'≤0.05, 1.9≤y'≤2. The materials and the structures of the steel base material and the composite insulating film layer in various examples and comparative examples are shown in Table 2.

It should be noted that in the aforementioned step S1 of the present invention, the selection of different steel substrate materials can respectively satisfy the production requirements of flexible continuous roll-to-roll type process and sheet-to-sheet type process with a bearing function for thin-film photovoltaic modules. Specifically, the SUS430 strip foil steel coil serving as a flexible substrate further needs to be subjected to a precision rolling process to achieve a thickness of 5 to 180 μm, and preferably, the thickness is controlled within a range of 15 to 50 μm to achieve good flexibility. For the sheet-like rigid B430LNT stainless steel plate, the thickness is controlled between 0.3 to 2.0 mm, and preferably between 0.4 to 1.0 mm.

Table 1 below lists the mass percentage of chemical components of the SUS430 and B430LNT types of steel.

In the present invention, all the process parameters of Examples 1-46 are in conformity with the requirements of the steps above, while in the Comparative Examples 1-8, there are parameters that do not satisfy the process requirements of the aforementioned steps.

Table 1 presents mass percentage of chemical components of the SUS430 and B430LNT types of steel.

TABLE 1

| | C | Si | Mn | P | S | Cr | N | Ti | Nb |
|---|---|---|---|---|---|---|---|---|---|
| | \(wt %, the balance being Fe and other inevitable impurities except for P and S\) | | | | | | | | |
| SUS430 | ≤0.120 | ≤0.75 | ≤1.00 | ≤0.040 | ≤0.030 | 16.0~18.0 | — | — | — |
| B430LNT | ≤0.020 | ≤0.60 | ≤1.00 | ≤0.040 | ≤0.015 | 16.0~18.0 | ≤0.020 | ≤0.30 | ≤0.30 |

According to the method of GB/T 4339, the thermal expansion coefficients of the SUS430 and B430LNT types of steel with a size of 25 mm×5 mm×0.5 mm are measured by a NETZSCH DIL thermal expansion coefficient measurement instrument, with the same temperature rising speed and a temperature dropping speed of 10° C./min. The test temperature is raised from 0° C. to 700° C., holding for 1 minute, and then is dropped. The thermal expansion coefficients in temperature ranges of 0 to 100° C., 100 to 315° C., and 315 to 650° C. are analyzed and fitted by software.

The measured thermal expansion coefficients of the selected SUS430 stainless steel are as follows: $10.4\times10^{-6}/°$C. in the temperature range of 0 to 100° C., $10.9\times10^{-6}/°$C. in the temperature range of 100 to 315° C., and $11.4\times10^{-6}/°$C. in the temperature range of 315 to 650° C.

The measured thermal expansion coefficients of the selected B430LNT stainless steel are as follows: $10.1\times10^{-6}/°$C. in the temperature range of 0 to 100° C., $10.5\times10^{-6}/°$C. in the temperature range of 100 to 315° C., and $11.2\times10^{-6}/°$C. in the temperature range of 315 to 650° C.

Table 2 presents compositions and film thicknesses of functional film systems of the coated steel plates suitable for the inline thin-film photovoltaic modules in Examples 1-46 and the comparative steel plates in Comparative Examples 1-8.

TABLE 2

| Number | Steel Substrate Steel Type | Steel Substrate Thickness (mm) | Steel Substrate Ra (nm) | Steel Substrate Rz (nm) | Composite Insulating Layer - Insulating Base Layer - First Layer Type | First Layer Thickness (nm) | Second Layer Type | Second Layer Thickness (nm) | Third Layer Type | Third Layer Thickness (nm) | Laser Scribing Buffer Layer Type | x or x' | y or y' | x:y or x':y' | Thickness (nm) |
|---|---|---|---|---|---|---|---|---|---|---|---|---|---|---|---|
| Example 1 | B430LNT | 0.5 | 60 | 95 | SiO$_2$ | 100 | / | / | / | / | Si$_x$N$_y$ | 3 | 4 | 0.75 | 200 |
| Example 2 | B430LNT | 0.5 | 59 | 103 | SiO$_2$ | 250 | / | / | / | / | Si$_x$N$_y$ | 3 | 4 | 0.75 | 200 |
| Example 3 | B430LNT | 0.8 | 89 | 205 | SiO$_2$ | 2000 | / | / | / | / | Si$_x$N$_y$ | 3 | 4 | 0.75 | 200 |
| Example 4 | B430LNT | 1.2 | 100 | 306 | SiO$_{1.97}$ | 4000 | / | / | / | / | Si$_x$N$_y$ | 3 | 4 | 0.75 | 200 |
| Example 5 | B430LNT | 1.3 | 134 | 575 | SiO$_2$ | 6000 | / | / | / | / | Si$_x$N$_y$ | 3 | 4 | 0.75 | 200 |
| Example 6 | B430LNT | 2.0 | 297 | 863 | SiO$_2$ | 9000 | / | / | / | / | Si$_x$N$_y$ | 3 | 4 | 0.75 | 200 |
| Example 7 | B430LNT | 0.4 | 59 | 99 | SiO$_2$ | 4000 | / | / | / | / | Si$_x$N$_y$ | 3 | 4 | 0.75 | 50 |
| Example 8 | B430LNT | 0.5 | 56 | 102 | SiO$_{1.97}$ | 4000 | / | / | / | / | Si$_x$N$_y$ | 3 | 4 | 0.75 | 100 |
| Example 9 | B430LNT | 0.5 | 60 | 173 | SiO$_{1.99}$ | 4000 | / | / | / | / | Si$_x$N$_y$ | 3 | 4 | 0.75 | 500 |
| Example 10 | B430LNT | 0.7 | 65 | 136 | SiO$_{1.96}$ | 4000 | / | / | / | / | SixN | 3 | 4 | 0.75 | 1000 |
| Example 11 | B430LNT | 0.9 | 61 | 256 | SiO$_2$ | 4000 | / | / | / | / | Si$_{1-x}$(Sb)$_x$O$_y$ | 0.0495 | 1.98 | 0.0255 | 200 |
| Example 12 | B430LNT | 0.9 | 63 | 312 | SiO$_2$ | 4000 | / | / | / | / | Si$_{1-x}$(Au)$_x$O$_y$ | 0.0493 | 1.97 | 0.0250 | 200 |
| Example 13 | B430LNT | 0.3 | 59 | 88 | SiO$_2$ | 4000 | / | / | / | / | Si$_{1-x}$(Cu)$_x$O$_y$ | 0.0488 | 1.90 | 0.0257 | 200 |
| Example 14 | B430LNT | 0.5 | 60 | 99 | SiO$_2$ | 4000 | / | / | / | / | Si$_{1-x}$(Sn)$_x$O$_y$ | 0.0493 | 1.91 | 0.0258 | 200 |
| Example 15 | B430LNT | 0.5 | 55 | 105 | SiO$_2$ | 4000 | / | / | / | / | Si$_{1-x}$(Ag)$_x$O$_y$ | 0.0496 | 1.95 | 0.0259 | 200 |
| Example 16 | B430LNT | 0.5 | 48 | 103 | SiO$_2$ | 4000 | / | / | / | / | Si$_x$N$_y$ | 3 | 3.9 | 0.77 | 200 |
| Example 17 | B430LNT | 0.9 | 56 | 113 | SiO$_2$ | 4000 | / | / | / | / | Si$_x$N$_y$ | 3 | 3.8 | 0.79 | 200 |
| Example 18 | B430LNT | 0.5 | 56 | 97 | SiO$_2$ | 4000 | / | / | / | / | Si$_x$N$_y$ | 1 | 1.17 | 0.85 | 200 |
| Example 19 | B430LNT | 0.5 | 60 | 103 | SiO$_2$ | 4000 | / | / | / | / | Si$_x$N$_y$ | 1 | 1.11 | 0.9 | 200 |
| Example 20 | B430LNT | 0.5 | 55 | 123 | HfO$_2$ | 100 | / | / | / | / | Si$_x$N$_y$ | 3 | 4 | 0.75 | 200 |
| Example 21 | B430LNT | 0.5 | 60 | 153 | HfO$_2$ | 2000 | / | / | / | / | Si$_x$N$_y$ | 3 | 4 | 0.75 | 200 |
| Example 22 | B430LNT | 0.5 | 60 | 127 | HfO$_2$ | 4000 | / | / | / | / | Si$_x$N$_y$ | 3 | 4 | 0.75 | 200 |
| Example 23 | B430LNT | 0.5 | 55 | 97 | Ta$_2$O$_5$ | 100 | / | / | / | / | Si$_x$N$_y$ | 3 | 4 | 0.75 | 200 |
| Example 24 | B430LNT | 0.5 | 60 | 98 | Ta$_2$O$_5$ | 2000 | / | / | / | / | Si$_x$N$_y$ | 3 | 4 | 0.75 | 200 |
| Example 25 | B430LNT | 0.9 | 64 | 125 | Ta$_2$O$_5$ | 4000 | / | / | / | / | Si$_x$N$_y$ | 3 | 4 | 0.75 | 200 |
| Example 26 | B430LNT | 0.5 | 56 | 95 | SiO$_2$ | 100 | HfO$_2$ | 100 | / | / | Si$_x$N$_y$ | 3 | 4 | 0.75 | 200 |
| Example 27 | B430LNT | 0.5 | 60 | 88 | SiO$_2$ | 3000 | HfO$_2$ | 3000 | / | / | Si$_x$N$_y$ | 3 | 4 | 0.75 | 200 |
| Example 28 | B430LNT | 0.5 | 60 | 99 | SiO$_2$ | 100 | Ta$_2$O$_5$ | 100 | / | / | Si$_x$N$_y$ | 3 | 4 | 0.75 | 200 |
| Example 29 | B430LNT | 0.5 | 66 | 123 | SiO$_2$ | 3000 | Ta$_2$O$_5$ | 3000 | / | / | Si$_x$N$_y$ | 3 | 4 | 0.75 | 200 |
| Example 30 | B430LNT | 0.5 | 46 | 99 | SiO$_2$ | 100 | HfO$_2$ | 100 | SiO$_2$ | 100 | Si$_x$N$_y$ | 3 | 4 | 0.75 | 200 |
| Example 31 | B430LNT | 0.5 | 60 | 135 | SiO$_2$ | 3000 | SiO$_2$ | 3000 | Ta$_2$O$_5$ | 3000 | Si$_x$N$_y$ | 3 | 4 | 0.75 | 200 |
| Example 32 | B430LNT | 0.5 | 56 | 93 | SiO$_2$ | 100 | Ta$_2$O$_5$ | 100 | SiO$_2$ | 100 | Si$_x$N$_y$ | 3 | 4 | 0.75 | 200 |
| Example 33 | B430LNT | 1.0 | 64 | 105 | SiO$_2$ | 3000 | HfO$_2$ | 3000 | HfO$_2$ | 3000 | Si$_x$N$_y$ | 3 | 4 | 0.75 | 200 |
| Example 34 | B430LNT | 0.5 | 63 | 104 | SiO$_2$ | 500 | HfO$_2$ | 500 | Ta$_2$O$_5$ | 500 | Si$_x$N$_y$ | 3 | 4 | 0.75 | 200 |
| Example 35 | B430LNT | 2.0 | 62 | 113 | Ta$_2$O$_5$ | 500 | Ta$_2$O$_5$ | 500 | Ta$_2$O$_5$ | 500 | Si$_x$N$_y$ | 3 | 4 | 0.75 | 200 |
| Example 36 | B430LNT | 0.5 | 60 | 112 | Si(Hf)O$_2$ | 100 | / | / | / | / | Si$_x$N$_y$ | 3 | 4 | 0.75 | 200 |
| Example 37 | B430LNT | 1.6 | 90 | 217 | Si(Hf)O$_2$ | 2000 | / | / | / | / | Si$_x$N$_y$ | 3 | 4 | 0.75 | 200 |
| Example 38 | B430LNT | 2.0 | 296 | 715 | Si(Hf)O$_2$ | 9000 | / | / | / | / | Si$_x$N$_y$ | 3 | 4 | 0.75 | 200 |
| Example 39 | SUS430 | 0.18 | 55 | 137 | SiO$_2$ | 100 | / | / | / | / | Si$_x$N$_y$ | 3 | 4 | 0.75 | 200 |
| Example 40 | SUS430 | 0.05 | 50 | 123 | SiO$_2$ | 500 | / | / | / | / | Si$_x$N$_y$ | 3 | 4 | 0.75 | 200 |
| Example 41 | SUS430 | 0.03 | 56 | 153 | SiO$_2$ | 1000 | / | / | / | / | Si$_x$N$_y$ | 3 | 4 | 0.75 | 200 |
| Example 42 | SUS430 | 0.15 | 50 | 137 | HfO$_2$ | 500 | / | / | / | / | Si$_x$N$_y$ | 3 | 4 | 0.75 | 200 |

TABLE 2-continued

| Number | Steel Substrate | | | | Composite Insulating Layer | | | | | | | | | |
|---|---|---|---|---|---|---|---|---|---|---|---|---|---|---|
| | | | | | Insulating Base Layer | | | | | | Laser Scribing Buffer Layer | | | |
| | | | | | First Layer | | Second Layer | | Third Layer | | | | | |
| | Steel Type | Thickness (mm) | Ra (nm) | Rz (nm) | Type | Thickness (nm) | Type | Thickness (nm) | Type | Thickness (nm) | Type | x or x' | y or y' | x:y or x':y' | Thickness (nm) |
| Example 43 | SUS430 | 0.025 | 45 | 98 | $Ta_2O_5$ | 100 | $SiO_2$ | 100 | $SiO_2$ | 100 | $Si_xN_y$ | 3 | 4 | 0.75 | 200 |
| Example 44 | SUS430 | 0.08 | 50 | 123 | $SiO_2$ | 100 | $HfO_2$ | 100 | $SiO_2$ | 100 | $Si_xN_y$ | 3 | 4 | 0.75 | 200 |
| Example 45 | SUS430 | 0.02 | 70 | 104 | $SiO_2$ | 200 | $HfO_2$ | 200 | $Ta_2O_5$ | 200 | $Si_xN_y$ | 3 | 4 | 0.75 | 200 |
| Example 46 | SUS430 | 0.05 | 50 | 123 | $SiO_2$ | 500 | $HfO_2$ | 500 | $SiO_2$ | 500 | $Si_xN_y$ | 3 | 4 | 0.75 | 200 |
| Comparative Example 1 | B430LNT | 0.5 | 50 | 109 | $SiO_2$ | 50 | / | / | / | / | / | / | / | / | / |
| Comparative Example 2 | B430LNT | 0.5 | 50 | 105 | $SiO_2$ | 80 | / | / | / | / | / | / | / | / | / |
| Comparative Example 3 | B430LNT | 2.0 | 285 | 984 | $SiO_2$ | 20000 | / | / | / | / | / | / | / | / | / |
| Comparative Example 4 | B430LNT | 1.8 | 253 | 879 | $SiO_2$ | 4000 | / | / | / | / | $Si_xN_y$ | 3 | 4 | 0.75 | <u>10</u> |
| Comparative Example 5 | B430LNT | 1.5 | 267 | 788 | $SiO_2$ | 4000 | / | / | / | / | $Si_xN_y$ | 3 | 4 | 0.75 | <u>30</u> |
| Comparative Example 6 | B430LNT | 0.5 | 50 | 152 | $SiO_2$ | 30 | $HfO_2$ | 30 | / | / | / | / | / | / | / |
| Comparative Example 7 | B430LNT | 0.5 | 50 | 143 | $SiO_2$ | 20 | $HfO_2$ | 20 | $SiO_2$ | 20 | / | / | / | / | / |
| Comparative Example 8 | B430LNT | 0.5 | 65 | 133 | $SiO_2$ | 5000 | $HfO_2$ | 5000 | $Ta_2O_5$ | 5000 | / | / | / | / | / |

In Table 2, the first layer of the insulating base layer is the layer in direct contact with the steel substrate, and the third layer is the layer farthest from the steel substrate in the insulating base layer. In the present invention, the comparative steels in Comparative Examples 1-3 and Comparative Examples 6-8 only comprise the steel substrate and the insulating base layer, without the laser scribing buffer layer. Comparative Examples 4-5 satisfy the limitations of claim 1 in this invention, where the steel substrate, the insulating base layer, and the laser scribing buffer layer are present. Comparative Examples 4 and 5 are included to demonstrate the impact of the thickness of the laser scribing buffer layer falling outside the preferred range.

Correspondingly, the coated steel plates suitable for inline thin-film photovoltaic modules in Examples 1-46 of the present invention all comprise a steel substrate and a composite insulating layer set on the surface of the steel substrate. The composite insulating layer comprises an insulating base layer adjacent to the steel substrate and a laser scribing buffer layer located above the insulating base layer. The insulating base layers in the coated steel plates in Examples 1-25 and Examples 36-42 is of a single-layer structure, while the insulating base layers in the coated steel plates in Examples 26-29 is of a double-layer structure, and the insulating base layers in the coated steel plates in Examples 30-35 and Examples 43-46 is of a three-layer structure.

Samples of the finished products of the coated steel plates suitable for inline thin-film photovoltaic modules in Examples 1-46 and the comparative steel plates in Comparative Examples 1-8, which are obtained by the steps above, are respectively taken and tested according to the following testing methods. The evaluation of various performance parameters are conducted, and the obtained test results are listed in Table 3. Tests for evaluating various performance parameters are as follows:

Adhesion test: conducted according to the one-hundred grid test specified in ASTM D3359. Scratches of 100 1 mm×1 mm grids are made on the surface of the steel strip with the composite insulating layer using a blade (observe the scratch depth, the depth of the scratch should reach the surface of the steel strip but not penetrate the steel strip). Apply 3M 610 tape on the scratched portion of the grid and press it firmly by hand to ensure tight contact between the tape and the grid surface. After approximately 60 seconds, lift the end of the tape that is not stuck and rapidly pull it up at an angle as close to 1800 as possible. Use a magnifying glass to inspect if there is any detachment or peeling in the grid area.

The specific evaluation criteria are as follows:
- ⊚: Indicates that the cut completely smooth with no detachment observed in the grid.
- ○: Indicates that there is slight detachment of the composite insulating layer at the intersections of the cuts, affecting approximately 5% of the grid area.
- Δ: Indicates that there is slight detachment of the composite insulating layer at the edges and intersections of the cuts, affecting approximately 5-15% of the grid area.
- x: Indicates that there is obvious strip-like peeling of the strip composite insulating layer at the edges of the cuts and parts of the grid, affecting more than 15% of the grid area.

Insulation performance test: on the surface of a plate strip sample with a size of 100 mm×100 mm, which is provided with a composite insulating layer, a 60 mm×60 mm×0.03 mm double-sided copper foil tape is applied in the center is applied in the center of the surface where the composite insulating layer of the steel strip sample is located (with a 20 mm margin from the edge), and it serves as one voltage terminal. The stainless steel substrate is used as the other voltage terminal, voltages of 50V, 100V, 250V, 500V, and 1,000V are respectively applied along the thickness direction of the composite insulating layer using an insulation tester. After reaching the test voltage, the voltage is held for 1 minute, and the resistance measurement results are recorded.

The specific evaluation criteria are as follows:
- ⊚: Indicates that the breakdown voltage is ≥250 V, and the measured resistance is ≥250 MΩ;
- ○: Indicates that the breakdown voltage is ≥100 V, and the measured resistance is ≥100 MΩ;
- Δ: Indicates that the breakdown voltage is ≥50 V, and the measurement resistance is ≥50 MΩ;
- x: Indicates that the breakdown voltage is ≤50 V, and there are surface defects or damage to the composite insulating layer, resulting in insulation failure.

High-temperature corrosion resistance test: a steel plate strip sample with a size of 100 mm×100 mm, which is provided with a composite insulating layer on the surface, is placed in a sealable heat treatment box, 50 mg of selenium (Se) powder and 50 mg of sulfur (S) powder are added into the heat treatment box. After the sealing the heat treatment box and evacuating it, Ar gas is introduced to achieve a pressure of 120 Torr. The heat treatment box is heated at a speed of 50° C./min to a 550° C. and is maintained at that temperature for 10 minutes. Afterward, it is cooled down to room temperature. Then, visual inspection and SEM (scanning electron microscope) observation are conducted to determine whether the surface of the composite insulating layer remains smooth and free of cracks.

The specific evaluation criteria are as follows:
- ⊚: Indicates that there are no significant changes in the composite insulating layer observed visually before and after the test; and the SEM observation shows a smooth and even surface of the composite insulating layer without any surface cracks.
- ○: Indicates that there are no significant changes in the composite insulating layer observed visually before and after the test; and the SEM observation shows a smooth and even surface of the composite insulating layer with a small amount of surface cracks, affecting less than 5% of the area.
- Δ: Indicates that there are no significant changes in the composite insulating layer observed visually before and after the test; and the SEM observation shows a smooth and even surface of the composite insulating layer with a certain amount of surface cracks, affecting approximately 5-15% of the area.
- x: Indicates that there is peeling of the composite insulating layer observed visually; and the SEM observation shows noticeable wrinkles and cracks in the composite insulating layer.

Deformation resistance test: after a steel plate strip sample with a size of 100 mm×100 mm, which is provided with a composite insulating layer on the surface, is stretched by 1%, a defect detection of the insulating layer on the surface is carried out using an optical method based on the color effects. Test solution: dissolve 3.0 g±0.1 g of sodium nitrite in 100 mL of deionized water and add 4 mL of phenolphthalein ethanol solution (with a mass fraction of phenolphthalein at 0.5%). Power supply: direct current voltage of 24 V±4 V. Test electrode: wet kitchen paper (with an area of 60 mm×60 mm), placed in the center (leaving a 20 mm margin)

placed in the center of the surface of the composite insulating layer of the test steel strip sample. Connect the stainless steel substrate of the steel strip sample to a negative electrode of the power supply, then connect the test electrode, i.e., the wet paper electrode, to a positive electrode of the power supply. Immerse the test electrode in the test solution and place it over the test area, ensuring no air enters. Turn on the power supply and after 2 minutes, turn it off. Within 1 minute of turning off the power supply, count the number of defects on the test electrode. Calculate the number of defects per square meter.

The evaluation criteria for a surface defect rate of the deformed composite insulating layer are as follows:
⊚: Indicates defects/m² ≤ 2;
○: Indicates 2 < defects/m² ≤ 5;
△: Indicates 5 < defects/m² ≤ 10; and
x: Indicates defects/m² > 10.

Table 3 presents various performance parameters of the coated steel plates suitable for inline thin-film photovoltaic modules in Examples 1-46 and the comparative steel plates in Comparative Examples 1-8 after sampling and testing.

TABLE 3

| Number | Adhesion | Insulation performance | High Temperature Corrosion Resistance | Deformation Resistance |
|---|---|---|---|---|
| Example 1 | ⊚ | △ | ⊚ | ○ |
| Example 2 | ⊚ | ○ | ⊚ | ○ |
| Example 3 | ⊚ | ⊚ | ⊚ | ○ |
| Example 4 | ⊚ | ⊚ | ⊚ | ⊚ |
| Example 5 | ⊚ | ⊚ | ⊚ | ⊚ |
| Example 6 | ○ | ⊚ | ⊚ | ⊚ |
| Example 7 | ⊚ | ⊚ | ⊚ | ⊚ |
| Example 8 | ⊚ | ⊚ | ⊚ | ⊚ |
| Example 9 | ⊚ | ⊚ | ⊚ | ⊚ |
| Example 10 | ⊚ | ⊚ | ⊚ | ⊚ |
| Example 11 | ⊚ | ⊚ | ⊚ | ○ |
| Example 12 | ⊚ | ⊚ | ⊚ | ○ |
| Example 13 | ⊚ | ⊚ | ⊚ | ⊚ |
| Example 14 | ⊚ | ⊚ | ⊚ | ⊚ |
| Example 15 | ⊚ | ⊚ | ⊚ | ⊚ |
| Example 16 | ○ | ⊚ | ⊚ | ⊚ |
| Example 17 | ○ | ⊚ | ⊚ | ⊚ |
| Example 18 | ○ | ⊚ | ⊚ | ⊚ |
| Example 19 | ○ | ⊚ | ⊚ | ⊚ |
| Example 20 | ○ | △ | ⊚ | ⊚ |
| Example 21 | ⊚ | ⊚ | ⊚ | ⊚ |
| Example 22 | ⊚ | ⊚ | ⊚ | ⊚ |
| Example 23 | ⊚ | △ | ⊚ | ⊚ |
| Example 24 | ⊚ | ⊚ | ⊚ | ⊚ |
| Example 25 | ⊚ | ⊚ | ⊚ | ⊚ |
| Example 26 | ⊚ | ○ | ⊚ | ⊚ |
| Example 27 | ○ | ⊚ | ⊚ | ⊚ |
| Example 28 | ⊚ | ○ | ⊚ | ⊚ |
| Example 29 | ○ | ⊚ | ⊚ | ⊚ |
| Example 30 | ⊚ | ○ | ⊚ | ⊚ |
| Example 31 | ○ | ⊚ | ⊚ | ⊚ |
| Example 32 | ○ | ○ | ⊚ | ⊚ |
| Example 33 | ○ | ⊚ | ⊚ | ⊚ |
| Example 34 | ⊚ | ⊚ | ⊚ | ⊚ |
| Example 35 | ⊚ | ⊚ | ⊚ | ⊚ |
| Example 36 | ⊚ | ○ | ○ | ○ |
| Example 37 | ○ | ⊚ | ⊚ | ○ |
| Example 38 | ○ | ⊚ | ⊚ | ○ |
| Example 39 | ○ | ○ | ⊚ | ○ |
| Example 40 | ⊚ | ○ | ⊚ | ○ |
| Example 41 | ⊚ | ⊚ | ⊚ | ○ |
| Example 42 | ⊚ | ○ | ⊚ | ○ |
| Example 43 | ○ | ○ | ⊚ | ○ |
| Example 44 | ○ | ○ | ⊚ | ⊚ |
| Example 45 | ⊚ | ⊚ | ⊚ | ⊚ |
| Example 46 | ⊚ | ⊚ | ⊚ | ○ |
| Comparative Example 1 | ⊚ | X | ⊚ | X |
| Comparative Example 2 | ⊚ | X | ⊚ | X |
| Comparative Example 3 | X | ⊚ | ⊚ | X |
| Comparative Example 4 | ⊚ | ⊚ | ⊚ | ⊚ |
| Comparative Example 5 | ⊚ | ⊚ | ⊚ | ⊚ |
| Comparative Example 6 | ⊚ | X | ⊚ | X |
| Comparative Example 7 | ⊚ | X | ⊚ | △ |
| Comparative Example 8 | △ | ⊚ | ⊚ | ⊚ |

It can be seen from Table 3 that the coated steel plates suitable for inline thin-film photovoltaic modules in Examples 1-46, manufactured using the manufacturing method of the present invention have undergone the aforementioned tests above and received ratings of "△" or higher for all evaluated properties. This indicates that the steel strips treated with the surface treatment in the present invention possess excellent or qualified interface adhesion, insulation performance, high-temperature corrosion resistance, and deformation resistance required as base material for the inline steel-based thin-film modules.

Correspondingly, after the coated steel plates in Examples 1-46 of the present invention and the comparative steel plates according to Comparative Examples 1-8 are obtained, it is possible to further deposit a metal bottom electrode as a back contact layers for different inline thin-film photovoltaic modules on the composite insulating layers. The material for the back contact layer can be one of the following: Mo or Mo alloy (for CIGS cells), Cu or Cu/C composite material (for CdTe cells), Al or Al alloy (for amorphous/microcrystalline silicon cells), and Ag, Au, or Pt (for GaAs photovoltaic cells, perovskite photovoltaic cells, and various organic semiconductor photovoltaic cells).

The thickness of the back contact layer formed by deposition of the metal bottom electrode should fall within a range of 20 nm to 2 μm, preferably within a range of 50 nm to 800 nm, and more preferably within a range of 50 nm to 500 nm. After the operation above is completed, a composite base plate suitable for use as the inline thin-film photovoltaic modules can be obtained. Depending on the requirements of the thin-film photovoltaic series-connected modules, the back contact layer can be processed by laser etching or mechanical scribing to obtain circuits with appropriate width and gap on the back contact layer.

In the present invention, to further verify whether the steel strip with the composite insulating layer on the surface satisfies the requirements for internal series connection of the inline steel-based thin-film modules, the steel strips in Examples 1-46 and Comparative Examples 1-8 above are processed by magnetron sputtering to prepare the back contact layer formed by the deposition of the Mo bottom electrode. The thickness of the formed back contact layer is 600±10 nm, and the square resistance is ≤1.0Ω/□. A laser scribing (P1) process in a thin-film module production process is performed on the steel strip coated with the back contact layer, and test data for various properties obtained is listed in Table 4.

The evaluation of various performance parameters of the steel strip is conducted as follows: A laser scribing test is performed on the steel strip coated with the back contact layer. Unlike the method of laser passing through glass for scribing on glass substrates, the laser directly performs scribing on the side coated with the back contact layer, which avoids the accumulation of volatile impurities at the scribing edges or damage to the insulating layer beneath the back electrode.

In the present invention, two types of lasers, infrared (1064 nm) and green (532 nm), are used for verification. The lasers used are commercially available lasers. The parameters of the infrared laser are: a laser wavelength of 1,064 nm, a pulse width of 15 to 30 ns, a repetition frequency of 1 to 150 kHz, and maximal single pulse energy of 0.28 mJ. The parameters of the green laser are: a laser wavelength of 532 nm, a pulse width of 6 to 18 ns, a repetition frequency of 1 to 120 kHz, and maximal single pulse energy of 0.10 mJ. The scribing length of the laser scribing (P1) process test is 80 mm, the scribing line width is controlled within at 50±5 m (≤10%), and the scribing rate is ≥500 mm/min.

The compatibility of the steel strip with the composite insulating layer on the surface with the existing inline thin-film module series connection process is evaluated according to the laser scribing results. Controlling a lower scribing edge protrusion can avoid the impact on subsequent light absorption layer deposition and the risk of short-circuiting the inline thin-film photovoltaic modules. Controlling damage of the scribing depth to the insulating base layer ensures the insulation of the base material, preventing the risks of electric leakage and even short circuits of the module due to local insulation failure.

The specific evaluation criteria are as follows:
⊙: Indicates that after laser P1 scribing, the height of the scribing edge protrusion (damage crater) is ≤30 nm, and the loss of insulating base layer thickness is ≤30 nm;
○: Indicates that after laser P1 scribing, the height of the scribing edge protrusion (damage crater) is greater than 30 nm and smaller than or equal to 50 nm, and the loss of insulating base layer thickness is greater than 30 nm and smaller than or equal to 50 nm;
Δ: Indicates that after laser P1 scribing, the height of the scribing edge protrusion (damage crater) is greater than 50 nm and smaller than or equal to 100 nm, and the loss of insulating base layer thickness is greater than 50 nm and smaller than or equal to 100 nm; and
x: Indicates that after laser P1 scribing, the height of the scribing edge protrusion (damage crater) is greater than 100 nm, and the loss of insulating base layer thickness is greater than 100 nm, or the insulating base layer is completely penetrated.

Table 4 presents the laser scribing compatibility test results for the coated steel plates/strips suitable for inline thin-film photovoltaic modules in Examples 1-46, as well as the comparative steel plates in Comparative Examples 1-8.

TABLE 4

| | Steel Strip Laser Scribing Compatibility Test | | | | | |
|---|---|---|---|---|---|---|
| | Infrared Laser | | | Green Laser | | |
| | Scribing Edge Protrusion (nm) | Insulating Base Layer Thickness Loss (nm) | Rating | Scribing Edge Protrusion (nm) | Insulating Base Layer Thickness Loss (nm) | Rating |
| Example 1 | 85 | 50 | Δ | 45 | 30 | ○ |
| Example 2 | 95 | 33 | Δ | 55 | 32 | ○ |
| Example 3 | 80 | 33 | Δ | 48 | 45 | ○ |
| Example 4 | 75 | 56 | Δ | 44 | 38 | ○ |
| Example 5 | 88 | 45 | Δ | 55 | 46 | ○ |
| Example 6 | 92 | 43 | Δ | 56 | 47 | ○ |
| Example 7 | 90 | 92 | Δ | 56 | 90 | Δ |
| Example 8 | 94 | 72 | Δ | 67 | 88 | Δ |
| Example 9 | 73 | 12 | Δ | 30 | 10 | ⊙ |
| Example 10 | 65 | 5 | Δ | 33 | 0 | ○ |
| Example 11 | 83 | 27 | Δ | 45 | 30 | ○ |
| Example 12 | 48 | 22 | ○ | 27 | 22 | ⊙ |
| Example 13 | 45 | 27 | ○ | 38 | 26 | ⊙ |
| Example 14 | 83 | 32 | Δ | 59 | 31 | Δ |
| Example 15 | 43 | 25 | ○ | 33 | 21 | ⊙ |
| Example 16 | 83 | 33 | Δ | 44 | 34 | ○ |
| Example 17 | 90 | 45 | Δ | 59 | 48 | Δ |
| Example 18 | 97 | 95 | Δ | 90 | 88 | Δ |
| Example 19 | 98 | 98 | Δ | 88 | 91 | Δ |
| Example 20 | 85 | 45 | Δ | 45 | 40 | ○ |
| Example 21 | 86 | 50 | Δ | 48 | 43 | ○ |
| Example 22 | 81 | 52 | Δ | 42 | 47 | ○ |
| Example 23 | 78 | 54 | Δ | 45 | 43 | ○ |
| Example 24 | 76 | 53 | Δ | 47 | 45 | ○ |
| Example 25 | 82 | 54 | Δ | 39 | 49 | ○ |
| Example 26 | 79 | 48 | Δ | 45 | 40 | ○ |
| Example 27 | 88 | 52 | Δ | 49 | 45 | ○ |
| Example 28 | 67 | 56 | Δ | 48 | 46 | ○ |
| Example 29 | 83 | 33 | Δ | 44 | 34 | ○ |
| Example 30 | 82 | 54 | Δ | 39 | 49 | ○ |
| Example 31 | 79 | 48 | Δ | 45 | 40 | ○ |
| Example 32 | 88 | 52 | Δ | 49 | 45 | ○ |
| Example 33 | 84 | 54 | Δ | 39 | 49 | ○ |
| Example 34 | 81 | 48 | Δ | 45 | 40 | ○ |
| Example 35 | 85 | 52 | Δ | 49 | 45 | ○ |

TABLE 4-continued

Steel Strip Laser Scribing Compatibility Test

| | Infrared Laser | | | Green Laser | | |
|---|---|---|---|---|---|---|
| | Scribing Edge Protrusion (nm) | Insulating Base Layer Thickness Loss (nm) | Rating | Scribing Edge Protrusion (nm) | Insulating Base Layer Thickness Loss (nm) | Rating |
| Example 36 | 83 | 49 | Δ | 46 | 42 | ○ |
| Example 37 | 87 | 49 | Δ | 48 | 48 | ○ |
| Example 38 | 81 | 58 | Δ | 42 | 42 | ○ |
| Example 39 | 85 | 30 | Δ | 45 | 30 | ○ |
| Example 40 | 95 | 33 | Δ | 55 | 32 | ○ |
| Example 41 | 80 | 33 | Δ | 48 | 45 | ○ |
| Example 42 | 75 | 32 | Δ | 44 | 38 | ○ |
| Example 43 | 88 | 45 | Δ | 55 | 46 | ○ |
| Example 44 | 78 | 54 | Δ | 45 | 43 | ○ |
| Example 45 | 76 | 53 | Δ | 47 | 45 | ○ |
| Example 46 | 82 | 54 | Δ | 39 | 49 | ○ |
| Comparative Example 1 | 3120 | 50 (completely penetrated) | X | 2110 | 50 (completely penetrated) | X |
| Comparative Example 2 | 3120 | 80 (completely penetrated) | X | 2100 | 80 (completely penetrated) | X |
| Comparative Example 3 | 4590 | 580 | X | 2130 | 485 | X |
| Comparative Example 4 | 4115 | 573 | X | 2098 | 365 | X |
| Comparative Example 5 | 4112 | 462 | X | 2104 | 334 | X |
| Comparative Example 6 | 3123 | 60 (completely penetrated) | X | 2108 | 60 (completely penetrated) | X |
| Comparative Example 7 | 3115 | 60 (completely penetrated) | X | 2105 | 60 (completely penetrated) | X |
| Comparative Example 8 | 4512 | 2678 | X | 3421 | 2257 | X |

It can be seen from Table 4 that the coated steel plates suitable for inline thin-film photovoltaic modules in Examples 1-46 have been tested by the commercial infrared or a green laser scriber. The evaluation ratings are at "Δ" level or above. This indicates that the coated steel plates in Examples 1-46 of the present invention have good compatibility with the laser scribing series connection process used in the inline thin-film photovoltaic module production process. Therefore, they can satisfy the production requirements of the inline thin-film photovoltaic modules. In contrast, the comparative steel plates in Comparative Examples 1-3 and 6-8 lack the absorption and buffering of the residual energy of the laser by the laser scribing buffer layer in the composite insulating film layer, and the thicknesses of the laser scribing buffer layers of the comparative steel in Comparative Examples 4-5 is outside the preferred thickness range, so the insulating base materials in Comparative Examples 1-8 experienced significant damage to the insulation base material, with some even being penetrated, causing insulation failure. Additionally, volatile deposits accumulated at the scribing edges, forming protrusions several micrometers high, which directly affects the deposition of the subsequent light absorption layer and the performance of the inline thin-film photovoltaic modules.

By considering Tables 1-4, it can be seen that compared to the comparative steel in Comparative Examples 1-8, the coated steel plates suitable for inline thin-film photovoltaic modules in Examples 1-46 of the present invention have excellent or qualified interface adhesion, insulation performance, high-temperature corrosion resistance, and deformation resistance required for serving as the base material for the inline steel-based thin-film modules, and they also have good compatibility with the laser scribing series connection process which is necessary during the production process of the inline thin-film photovoltaic modules.

FIG. 1 is shows the microstructure of the SUS430 steel substrate. The SUS430 steel substrate exhibits an austenite structure at high temperatures, which transforms into ferrite and carbides during the cooling process. This phase transformation refines the ferrite grains, and the precipitated carbides also hinder grain growth.

Figure 2:
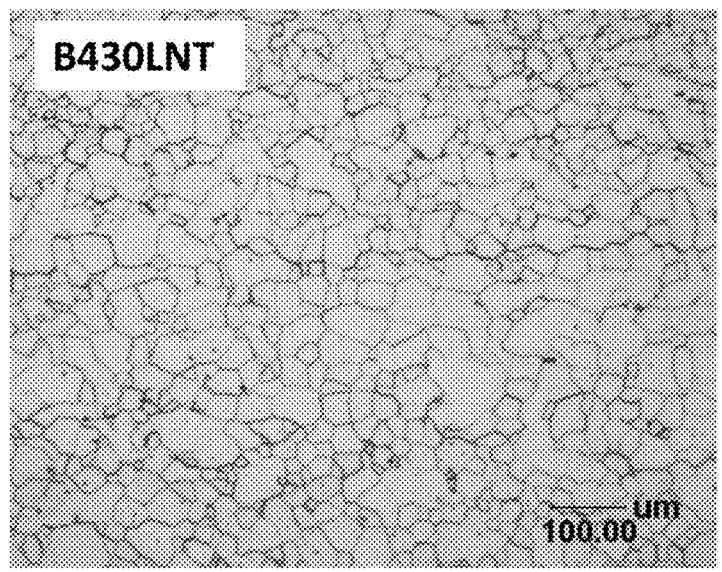
FIG. 2 is a microstructure image of B430LNT steel substrate.

FIG. 2 is shows the microstructure of the B430LNT steel substrate. The B430LNT steel substrate remains in a single-phase ferrite structure at high temperatures without undergoing any phase transformation. Therefore, it can withstand high temperature. Additionally, B430LNT does not have carbides pinning grain boundaries and preventing the growth of the grains, which allows for larger grain sizes compared to SUS430.

Figure 3:
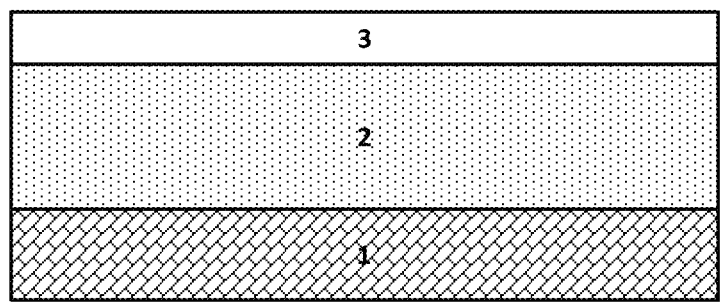
FIG. 3 is a schematic diagram of sectional structure of the coated steel plate in Example 3.

FIG. 3 is a schematic diagram of sectional structure of the coated steel plate according to Example 3. In FIG. 3, 1 represents the steel substrate, 2 represents the insulating base layer, and 3 represents the laser scribing buffer layer.

Figure 4:
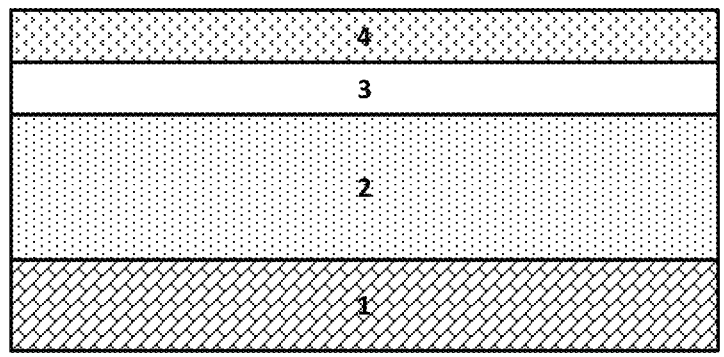
FIG. 4 is a schematic diagram of sectional structure of the coated steel plate in Example 3 after a back contact layer is formed by the deposition of a metal bottom electrode.

FIG. 4 is a schematic diagram of sectional structure of the coated steel plate according to Example 3, after a back contact layer is formed by the deposition of a metal bottom electrode. In FIG. 4, 1 represents the steel substrate, 2 represents the insulating base layer, 3 represents the laser scribing buffer layer, and 4 represents the back contact layer.

Figure 5:
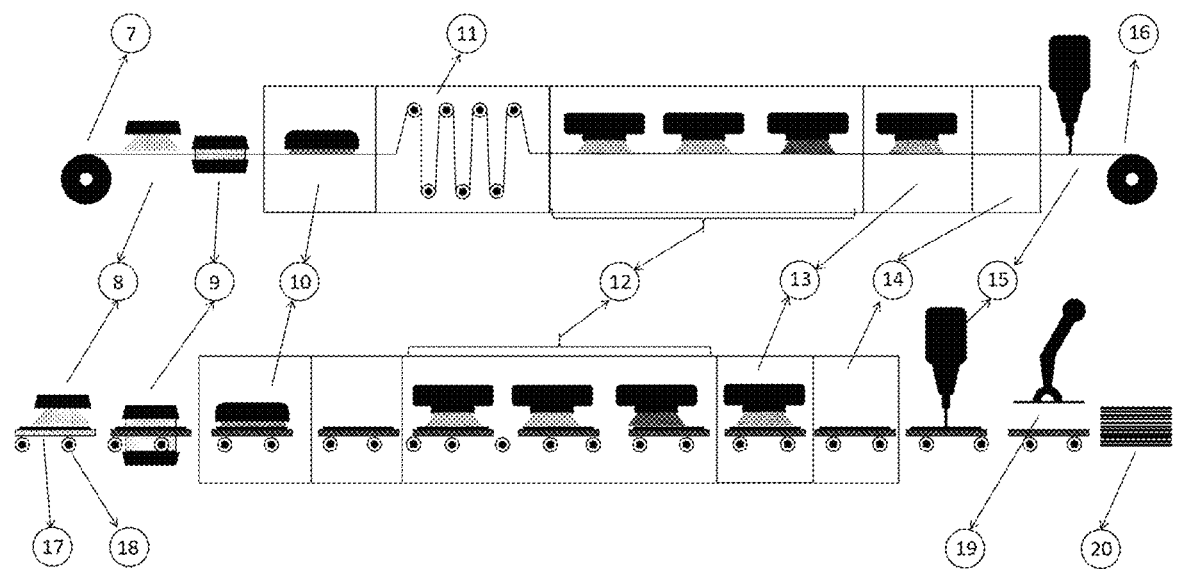
FIG. 5 is a schematic diagram of the production process of the continuous coating line in the present invention.

FIG. 5 is a schematic diagram of a production process of a continuous coating line of the present invention.

In the present invention, for the coating of the steel substrate, production can be carried out in different production lines by using a roll-to-roll strip such as SUS430, or using a sheet-to-sheet type strip such as B430LNT. It should be pointed out that the difference between roll-to-roll type and sheet-to-sheet type coatings lies in the stepping and transmission of the roll or sheet material. However, the entire coating process and methods are similar.

As mentioned above, before coating production on the surface of the steel substrate, it is necessary to first remove the residual or adsorbed dust on the surface of the steel substrate by high pressure water flushing. Subsequently, the steel substrate surface is rapidly dried by continuous blowing with high-speed compressed air. Then, plasma-assisted etching technology or extreme ultraviolet irradiation is employed to remove residual small organic molecules on the surface of the steel substrate and improve the reactivity of the surface of the steel substrate, thereby obtaining good adhesion between the insulating base layer and the steel substrate. Finally, vacuum coating systems such as magnetron sputtering, thermal evaporation, electron beam (EB) evaporation, and chemical vapor deposition (CVD) are used to deposit the insulating base layer and the laser scribing buffer layer. These processes are all prior art in the field.

As shown in FIG. 5, this production line of continuous coating process can be divided into two types: roll-to-roll type continuous coating line and a sheet-to-sheet type stepping coating line. The first part of the roll-to-roll type continuous coating line is an uncoiler 7, followed by a high pressure water injection cleaning section 8, a compressed air blow-drying section 9, an extreme ultraviolet surface cleaning and activation chamber 10 filled with $N_2$ atmosphere, and a looper vacuum transition chamber 11. The vacuum condition gradually transitions to $1\times10^{-4}$ Pa or below in the looper vacuum transition chamber 11. The looper equipment is used to control the coating rate and rolling speed switching in the roll changing process. Then, there are a series of deposition coating chambers 12 are disposed behind the looper vacuum transition chamber 11. The number of the coating chambers required can change within a range of 3 to 10 according to the coating rate and the film system structure to obtain the desired insulating base layer and the laser scribing buffer layer. A separate deposition chamber 13 for coating the metal back electrode is disposed behind the deposition coating chambers 12. After that, there are a transition chamber 14, a laser scribing equipment 15 for etching the circuit on the surface of the metal back electrode, and finally, a coiler for coiling the coated steel strip. Depending on the product requirements, it is possible to choose whether to equip a separate deposition chamber 13 for the metal back electrode and a laser scribing equipment 15. The sheet-to-sheet type stepping coating line has similar functional blocks to the roll-to-roll type continuous coating line. The stainless steel strip to be coated is placed on an object table 17 with magnetic fixation capability. The object table 17 together with the stainless steel strip placed thereon are conveyed by a conveying roller 18 arranged throughout the entire coating line. The subsequent sections include a high pressure water injection cleaning section 8, a compressed air blow-drying section 9, an extreme ultraviolet surface washing and activation chamber 10 filled with $N_2$ atmosphere, and a vacuum transition chamber 11 for gradually transitioning to a vacuum condition of $1\times10^{-4}$ Pa or below. A series of deposition coating chambers 12 are disposed behind the vacuum transition chamber 11, and the number of the coating chambers required can change within a range of 3 to 10 depending on the coating rate and the film system structure to obtain the desired insulating base layer system and the laser scribing buffer layer. A separate deposition chamber 13 for coating the metal back electrode is disposed behind the deposition coating chambers 12 followed by a transition chamber 14, a laser scribing equipment 15 for etching the circuits on the surface of the metal back electrode, and finally, a manipulator 19 with a magnetic attraction or grabbing function. After releasing the magnetic fixation of the object table, the stainless steel strip coated with the functional film layer is transferred to a centralized blanking stacking location. Similarly, depending on the product requirements, it is possible to choose whether to equip a separate deposition chamber 13 for the metal back electrode and a laser scribing equipment 15.

Figure 6:
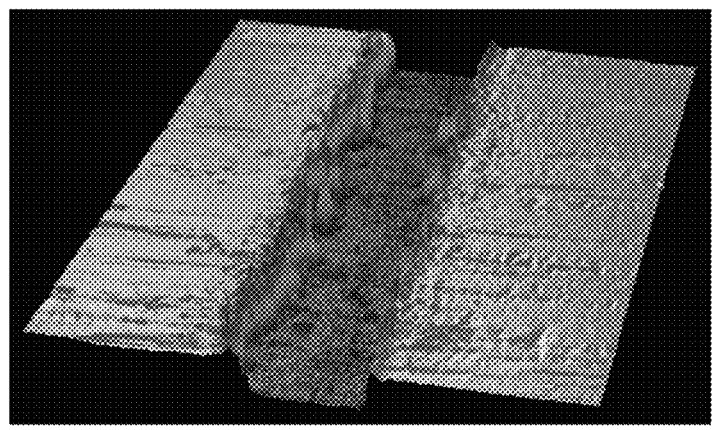
FIG. 6 is a three-dimensional representation of a surface of the coated steel plate with a back contact layer in Example 4 after laser scribing.

FIG. 6 is a three-dimensional representation of the coated steel plate with a back contact layer in Example 4 after laser scribing.

Figure 7:
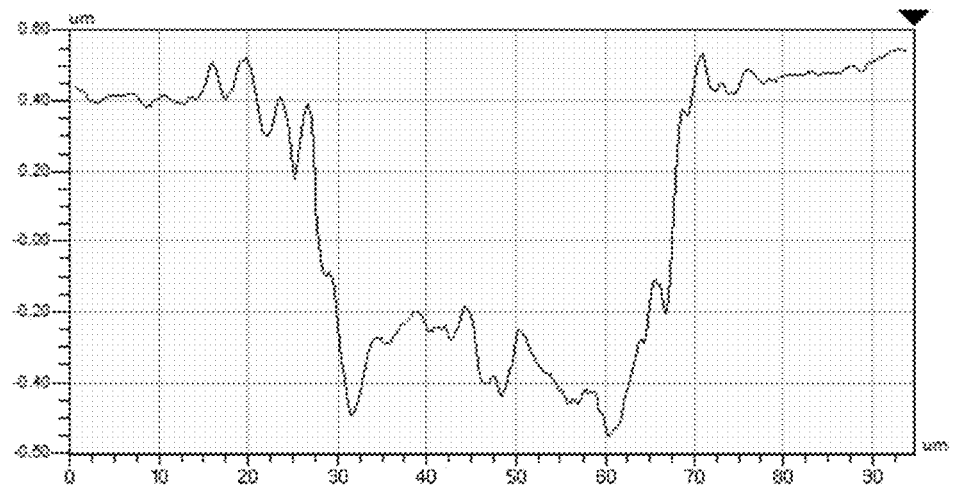
FIG. 7 is a sectional profile of the back contact layer in FIG. 6.

FIG. 7 is a sectional profile of the back contact layer in FIG. 6.

As shown in FIG. 6 and FIG. 7, in the implementation mode of Example 4, after laser scribing, the thickness loss of the insulating base layer is less than 10%, and the height of the protrusion formed at the scribing edge is less than 100 nm, which does not affect the deposition of the subsequent light absorption film layer and the performance of the inline thin-film photovoltaic modules.

Figure 8:
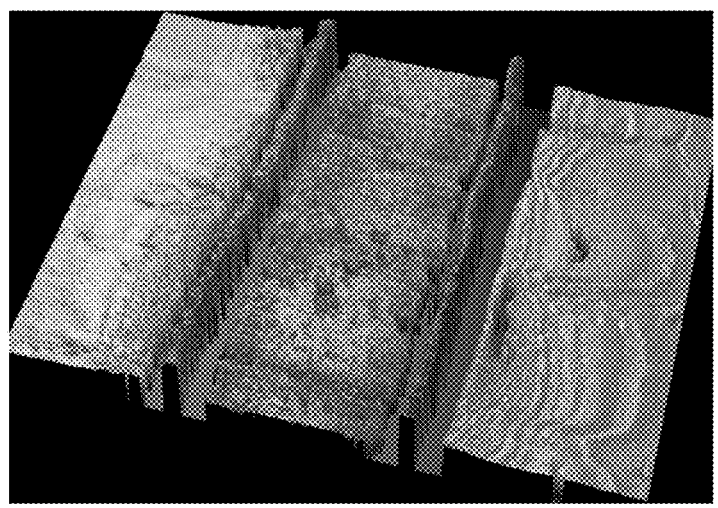
FIG. 8 is a three-dimensional representation of a surface of the comparative steel plate with a back contact layer in Comparative Example 3 after laser scribing.

FIG. 8 is a three-dimensional representation of the comparative steel plate with a back contact layer in Comparative Example 3 after laser scribing.

Figure 9:
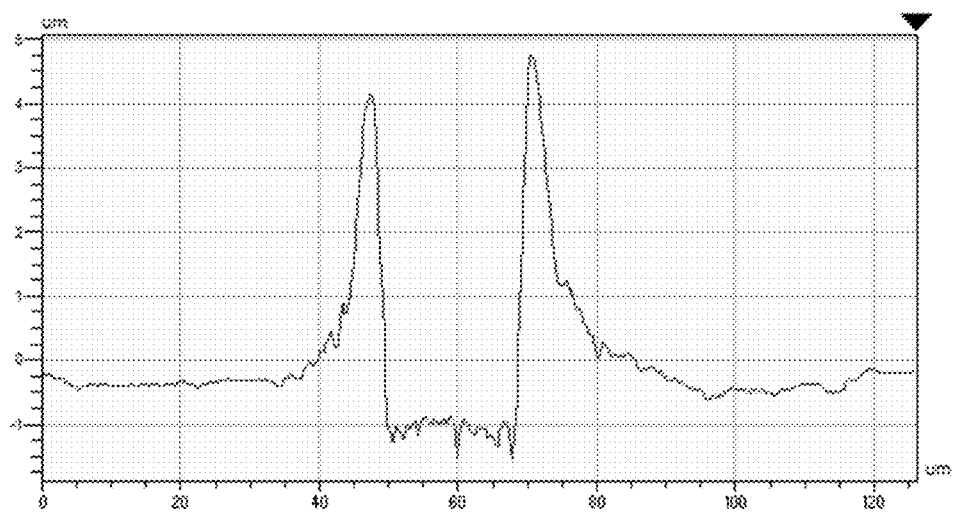
FIG. 9 is a sectional profile of the back contact layer in FIG. 8.

FIG. 9 is a sectional profile of the back contact layer in FIG. 8.

As shown in FIG. 8 and FIG. 9, the insulating base material in the comparative steel plate in Comparative Example 3 has suffered significant damage, even penetrating through the steel substrate, resulting in insulation failure. Additionally, volatile deposits accumulated at the scribing edge, forming protrusions of several micrometers, directly affecting the deposition of the subsequent light absorption film layer and the performance of the inline thin-film photovoltaic modules.

In summary, the embodiments above provided by the present invention are illustrative examples that demonstrate the principles and advantages of the present invention, rather than limiting the present invention. Those skilled in the art can make modifications or changes to the embodiments above without departing from the spirit and scope of the present invention. Therefore, all equivalent modifications or changes accomplished by those skilled in the art with ordinary knowledge in the technical field, within the spirit and the technical concepts disclosed by the present invention shall still be encompassed by the claims of the present invention.

The invention claimed is:

1. A coated steel plate suitable for an inline thin-film photovoltaic module, comprising a steel substrate and a composite insulating layer on a surface of the steel substrate, wherein
   the composite insulating layer comprises an insulating base layer and a laser scribing buffer layer; one side of the insulating base layer is the steel substrate, and the other side is the laser scribing buffer layer; and
   the laser scribing buffer layer contains at least one of the following components:
   $Si_xN_y$, where $0.75 \leq x$: $y \leq 1$; and
   $Si_{1-x'}(R)_{x'}O_{y'}$, where R is at least one element selected from Sb, Au, Cu, Sn, and Ag, and $0<x'\leq0.05$, $1.9\leq y'\leq2$.

2. The coated steel plate according to claim 1, wherein in the $Si_xN_y$, $0.75<x:y<0.90$.

3. The coated steel plate according to claim 1, wherein a thickness of the laser scribing buffer layer is 50 to 1,000 nm.

4. The coated steel plate according to claim 3, wherein the thickness of the laser scribing buffer layer is 100 to 500 nm.

5. The coated steel plate according to claim 1, wherein the insulating base layer contains at least one of the following components: $SiO_2$-m, $HfO_2$-m, Si $(Hf)O_2$-m, and $Ta_2O_5$-2m, where $0 \le m \le 0.05$.

6. The coated steel plate according to claim 5, wherein the insulating base layer is composed of at least one of the following components: $SiO_2$-m, $HfO_2$, Si $(Hf)O_2$, and $Ta_2O_5$, where $0 \le m \le 0.05$.

7. The coated steel plate according to claim 1, wherein the insulating base layer is of a single-layer structure or a multi-layer structure.

8. The coated steel plate according to claim 7, wherein a total thickness of the insulating base layer is 0.1 to 9 μm.

9. The coated steel plate according to claim 8, wherein the total thickness of the insulating base layer is 0.25 to 6 μm.

10. The coated steel plate according to claim 1, wherein:
a thermal expansion coefficient of the steel substrate at 0 to 100° C. is (10 to 11)×10−6/° C . . . ;
the thermal expansion coefficient of the steel substrate at 100 to 315° C. is (10.5 to 11)×10−6/° C . . . ; and
the thermal expansion coefficient of the steel substrate at 315 to 650° C. is (11 to 11.5)×10−6/° C.

11. The coated steel plate according to claim 10, wherein the steel substrate is a strip foil steel coil, having a thickness of 5 to 180 μm.

12. The coated steel plate according to claim 11, wherein the thickness of the strip foil steel coil is 15 to 50 μm.

13. The coated steel plate according to claim 10, wherein the steel substrate is a sheet-like rigid plate, having a thickness of 0.3 to 2.0 mm.

14. The coated steel plate according to claim 13, wherein the thickness of the sheet-like rigid plate is 0.4 to 1.0 mm.

15. The coated steel plate according to claim 10, wherein an arithmetic mean deviation of the profile, Ra, representing surface roughness of the steel substrate, is smaller than 0.3 μm, and a maximum height of the profile, Rz, representing the surface roughness of the steel substrate, is smaller than 1 μm.

16. The coated steel plate according to claim 15, wherein Ra<0.07 μm, and/or Rz<0.3 μm.

17. The coated steel plate according to claim 1, wherein the composite insulating layer has a back contact layer formed by depositing a metal bottom electrode on its surface;
a material of the back contact layer comprises at least one of the following: Mo or Mo alloy, Cu or a Cu/C composite material, Al or Al alloy, Ag, Au, and Pt; and
a thickness of the back contact layer is 20 nm to 2 μm.

18. A method for manufacturing the coated steel plate according to claim 1, comprising the following steps:
preprocessing a surface of the steel substrate; and
depositing the insulating base layer and the laser scribing buffer layer on the surface of the steel substrate.

* * * * *